United States Patent
Hashim et al.

(10) Patent No.: US 7,410,367 B2
(45) Date of Patent: Aug. 12, 2008

(54) NEXT HIGH FREQUENCY IMPROVEMENT BY USING FREQUENCY DEPENDENT EFFECTIVE CAPACITANCE

(75) Inventors: Amid Hashim, Plano, TX (US); Julian Robert Pharney, Indianapolis, IN (US)

(73) Assignee: Commscope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 11/657,024

(22) Filed: Jan. 24, 2007

(65) Prior Publication Data

US 2007/0133185 A1   Jun. 14, 2007

Related U.S. Application Data

(63) Continuation of application No. 10/845,104, filed on May 14, 2004, now Pat. No. 7,190,594.

(51) Int. Cl.
*H01R 12/00* (2006.01)
(52) U.S. Cl. .................. 439/76.1; 439/676; 439/941
(58) Field of Classification Search .............. 439/676, 439/76.1, 941
See application file for complete search history.

(56) References Cited

U.S. PATENT DOCUMENTS

| | | | |
|---|---|---|---|
| 5,396,397 A | 3/1995 | McClanahan et al. | |
| 5,700,167 A | 12/1997 | Pharney et al. | |
| 5,915,989 A | 6/1999 | Adriaenssens et al. | |
| 5,997,358 A | 12/1999 | Adriaenssens et al. | |
| 6,042,427 A | 3/2000 | Adriaenssens et al. | |
| 6,050,843 A | 4/2000 | Adriaenssens et al. | |
| 6,057,743 A * | 5/2000 | Aekins | 333/1 |
| 6,089,923 A | 7/2000 | Phommachanh | |
| 6,168,474 B1 | 1/2001 | German et al. | |
| 6,215,372 B1 | 4/2001 | Novak | |
| 6,270,381 B1 | 8/2001 | Adriaenssens et al. | |
| 6,353,540 B1 | 3/2002 | Akiba et al. | |
| 6,379,157 B1 | 4/2002 | Curry et al. | |
| 6,441,314 B2 | 8/2002 | Rokugawa et al. | |

(Continued)

FOREIGN PATENT DOCUMENTS

EP   1 059 704 A2   12/2000

(Continued)

OTHER PUBLICATIONS

Ragu Natarajan and J.P. Dougherty, "Material Compatibility and Dielectric Properties of Co-Fired High and Low Dielectric Constant Ceramic Packages," IEEE 1997 Electronic Components and Technology Conference.

(Continued)

*Primary Examiner*—Ross N Gushi
(74) *Attorney, Agent, or Firm*—Muncy, Geissler, Olds & Lowe, PLLC

(57) ABSTRACT

A connector is provided for simultaneously improving both the NEXT high frequency performance when low crosstalk plugs are used and the NEXT low frequency performance when high crosstalk plugs are used. The connector includes a first compensation structure provided on an inner metalized layer of the PCB at a first stage area of the PCB, and a second compensation structure, provided at a second stage area of the PCB, for increasing compensation capacitance with increasing frequency.

20 Claims, 13 Drawing Sheets

U.S. PATENT DOCUMENTS

| | | | |
|---|---|---|---|
| 6,483,715 B1 * | 11/2002 | Chen | 361/760 |
| 6,509,779 B2 | 1/2003 | Yue et al. | |
| 6,528,145 B1 | 3/2003 | Berger et al. | |
| 6,533,618 B1 | 3/2003 | Aekins | |
| 6,538,210 B2 | 3/2003 | Sugaya et al. | |
| 6,563,058 B2 | 5/2003 | Mizutani et al. | |
| 6,603,668 B2 | 8/2003 | Iwanami | |
| 6,663,946 B2 | 12/2003 | Seri et al. | |
| 6,678,144 B2 | 1/2004 | Higashi et al. | |
| RE38,519 E | 5/2004 | Doorhy et al. | |
| 6,734,542 B2 | 5/2004 | Nakatani et al. | |
| 6,799,989 B2 | 10/2004 | Doorhy et al. | |
| 6,865,090 B2 | 3/2005 | Wajima et al. | |
| 6,923,673 B2 | 8/2005 | Doorhy et al. | |
| 6,972,893 B2 | 12/2005 | Chen et al. | |
| 6,984,886 B2 | 1/2006 | Ahn et al. | |
| 7,114,985 B2 | 10/2006 | Doorhy et al. | |
| 7,153,168 B2 | 12/2006 | Caveney et al. | |
| 7,179,131 B2 | 2/2007 | Caveney et al. | |
| 7,182,649 B2 | 2/2007 | Caveney et al. | |
| 7,252,554 B2 | 8/2007 | Caveney et al. | |
| 7,309,261 B2 | 12/2007 | Caveney et al. | |
| 2001/0048592 A1 | 12/2001 | Nimomiya | |
| 2002/0088977 A1 | 7/2002 | Mori et al. | |
| 2002/0195270 A1 | 12/2002 | Okubora et al. | |
| 2003/0024732 A1 | 2/2003 | Ninomiya | |
| 2003/0075356 A1 | 4/2003 | Horie | |
| 2003/0174484 A1 | 9/2003 | Pai et al. | |
| 2003/0218870 A1 | 11/2003 | Fisher et al. | |
| 2004/0040740 A1 | 3/2004 | Nakatani et al. | |
| 2004/0147165 A1 | 7/2004 | Celella et al. | |
| 2004/0184247 A1 | 9/2004 | Adriaenssens et al. | |
| 2005/0199422 A1 | 9/2005 | Hashim et al. | |

FOREIGN PATENT DOCUMENTS

WO     WO 03/019734 A1     3/2003

OTHER PUBLICATIONS

Gary D. Alley, "Interdigital Capacitors and Their Application to Lumped-Element Microwave Integrated Circuits," IEEE Transactions on Microwave Theory and Techniques, 1970, vol. 18, No. 12, p. 1028-1033.

* cited by examiner

NEXT HIGH FREQUENCY IMPROVEMENT BY USING FREQUENCY DEPENDENT EFFECTIVE CAPACITANCE

This application is a continuation of prior application Ser. No. 10/845,104, filed May 14, 2004 now U.S. Pat. No. 7,190,594.

BACKGROUND OF THE INVENTION

1. Field of the Invention

The present invention relates to near-end crosstalk (NEXT) compensation in connectors and, more particularly, to a technique of canceling or reducing NEXT in a multi-stage compensated system by providing frequency dependent effective capacitance.

2. Discussion of the Related Art

Noise or signal interference between conductors in a connector is known as crosstalk. Crosstalk is a common problem in communication devices using connectors. Particularly, in a communication system where a modular plug often used with a computer is to mate with a modular jack, the electrical wires (conductors) within the jack and/or plug produce near-end crosstalk (NEXT), i.e., a crosstalk over closely-positioned wires over a short distance. A plug, due to its configuration or to the manner in which cordage is terminated to it, can produce a high crosstalk or a low crosstalk. A plug with a high crosstalk is herein referred to as a high crosstalk plug, and a plug with a low crosstalk is herein referred to as a low crosstalk plug.

U.S. Pat. No. 5,997,358 issued to Adriaenssens et al. (hereinafter "the '358 patent") describes a two-stage scheme for compensating such NEXT. The entire contents of the '358 patent are incorporated by reference. Further, the subject matters of U.S. Pat. Nos. 5,915,989; 6,042,427; 6,050,843; and 6,270,381 are also incorporated by reference.

The '358 patent reduces the NEXT (original crosstalk) between the electrical wire pairs of a modular plug by adding a fabricated or artificial crosstalk, usually in the jack, at two stages, thereby canceling the crosstalks or reducing the overall crosstalk for the plug-jack combination. The fabricated crosstalk is referred to herein as a compensation crosstalk. This idea is typically implemented using capacitive and/or inductive compensation in two stages. This idea can be realized, for example, by crossing the path of one of the conductors of one of the pairs of a pair combination to be compensated, within the connector twice, thereby providing two stages of NEXT compensation. This scheme is more efficient at reducing the NEXT than a scheme whereby the compensation is added at a single stage, especially when, as is usually the case, the compensation can not be introduced except after a time delay.

Although effective, the NEXT compensating scheme of the '358 patent suffers a drawback in that the NEXT margin relative to the Telecommunications Industry Association (TIA) limit line deteriorates at low frequency (below approximately 100 MHz) when a high crosstalk plug is used with the jack, and at high frequency (beyond approximately 250 MHz) when a low crosstalk plug is used with the jack. More specifically, when the net compensation crosstalk in a two-stage compensated jack is less than the original crosstalk (i.e. when a high crosstalk plug is inserted into the jack), the plug-jack combination is said to be under-compensated, and the resultant NEXT frequency characteristic will build-up to a peak at low frequencies before a null sets in at a frequency point determined by the inter-stage delays and the magnitudes of the compensating stages. Then the slope of the NEXT magnitude frequency response changes from a shallow slope before the null to a steep slope after the null, thereby causing the NEXT to deteriorate rapidly at high frequencies, i.e., at frequencies beyond these nulls.

On the other hand, when the net compensation crosstalk in such a jack is more than the original crosstalk (i.e. when a low crosstalk plug is inserted), the plug-jack combination is said to be over-compensated, and the resultant NEXT frequency characteristic will not have a null, but the slope of the NEXT frequency characteristic will gradually increase tending towards 60 dB/decade at very high frequencies, far exceeding the TIA limit slope of 20 dB/decade.

Thus, while the low frequency margin (low frequency performance of the connector), when a high crosstalk plug is used with the jack, can be improved by increasing the compensation level, such an action would lead to further deterioration of the high frequency margin (high frequency performance of the connector) when a low crosstalk plug is used with the jack. Conversely, while the high frequency margin, when a low crosstalk plug is used with the jack, can be improved by decreasing the compensation level, such an action would lead to further deterioration of the low frequency margin when a high crosstalk plug is used with the jack.

Therefore, there exists a need for a technique capable of simultaneously reducing or canceling NEXT at high frequencies when low crosstalk plugs are used, and at low frequencies when high crosstalk plugs are used.

SUMMARY OF THE INVENTION

The present invention overcomes the problems and limitations of the related art techniques of reducing NEXT in connectors. Particularly, the present invention provides a multi-stage crosstalk compensation scheme in which the resultant capacitive coupling is biased in such a way as to reduce the overall compensation level as the frequency increases, thereby improving significantly the high frequency NEXT performance of the connector without degrading the low frequency NEXT performance. This is achieved by providing a first stage compensation structure that has a relatively flat effective capacitance response as the frequency increases, while providing a second stage compensation structure that has an increasing effective capacitance response as the frequency increases.

The present invention improves both the low frequency (e.g., 1-100 MHz) crosstalk performance and the high frequency (e.g., 250-500 MHz; or 500 MHz and greater) crosstalk performance of modular outlets and panels.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Reference will now be made in detail to the preferred embodiments of the present invention, examples of which are illustrated in the accompanying drawings. In the present application, a 'stage' is referred to a place of compensation, which occurs at a compensation delay point. The present invention provides various configurations of printed circuit boards (PCBs) which can replace the printed wiring board of FIG. 7A in the '358 patent.

The present invention provides a compensation structure at a second stage of a multi-stage NEXT compensation system for a connector. This second stage has an increasing effective capacitance response as the frequency increases. This can be achieved by using a series inductor(L)-capacitor(C) combination structure, a high length/width ratio interdigital capacitor, an elongated folded interdigital capacitor, or an open-circuited transmission lines in a connector, according to the different embodiments of the present invention.

Figure 1:
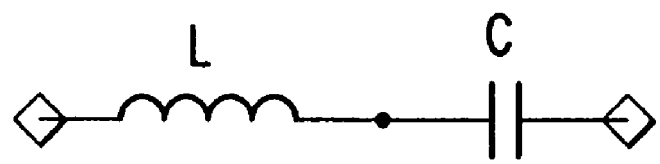
FIG. 1 shows a series inductor-capacitor combination structure used in the present invention.

FIG. 1 shows a series L-C combination structure according to a first embodiment of the present invention. The equation for the effective capacitance ($C_{eff}$) for this series L-C combination structure is as follows:

$$C_{eff} = \frac{C}{1 - (2\pi f)^2 LC}$$

where f is the frequency, C represents the capacitance of the capacitor, and L represents the inductance of the inductor. As can be seen from this equation, the effective capacitance $C_{eff}$ increases with frequency at frequencies that are less than the resonant frequency $f_{res}$ of the series L-C combination. The resonant frequency $f_{res}$ is defined as follows:

$$f_{res} = \frac{1}{2\pi \sqrt{LC}}$$

According to the present invention, L and C are chosen such that the resonant frequency $f_{res}$ occurs above the highest operating frequency of the bandwidth of interest. This allows the effective capacitance to increase as the frequency increases up to the resonant frequency $f_{res}$.

Figure 2:
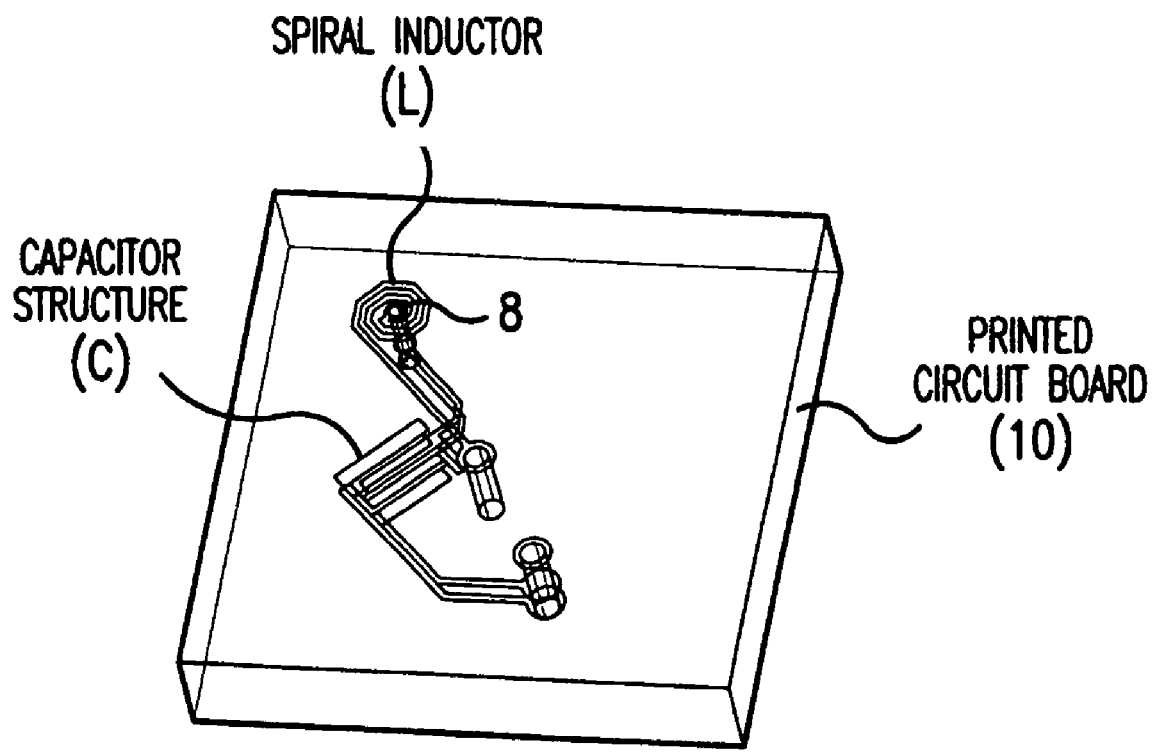
FIG. 2 is a perspective view of a simplified printed circuit board (PCB) showing an example of how the series inductor-capacitor combination of FIG. 1 can be implemented according to a first embodiment of the present invention.

FIG. 2 is a perspective view of a simplified PCB showing how the series L-C combination structure of FIG. 1 is implemented according to a first embodiment of the present invention. As shown in FIG. 2, the series L-C combination structure of FIG. 1 is provided with a PCB. Here, details of the printed circuits are not shown. The inductor L in this example is implemented with a spiral inductor having a spiral structure residing on a top surface of the PCB. The capacitor C in this example is implemented with a capacitor structure composed of two interdigital capacitors electrically in parallel to each other residing at inner layers of the PCB. An interdigital capacitor is a capacitor having a co-planar arrangement of two inter-meshed metal combs each at a different potential, and is known. The capacitor C is electrically connected to the inductor L through a conductive via 8 such as a plated through hole. Note that for the purpose of the first embodiment of this invention, the series capacitor of FIG. 1 can also be implemented using a simple parallel plate capacitor configured on two layers of the PCB.

Figure 3:
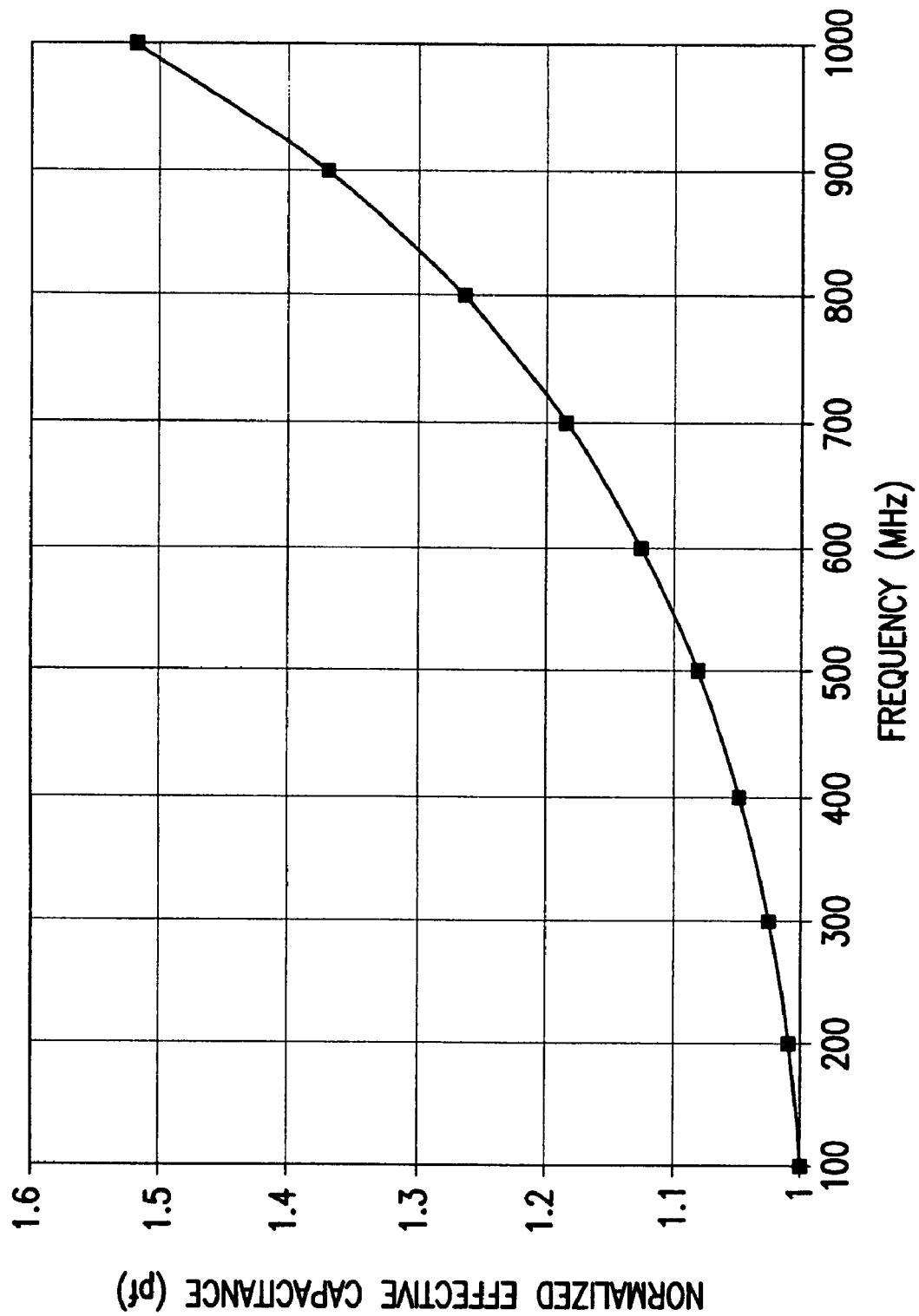
FIG. 3 is a graph showing a simulated example of the effective capacitance v. frequency response of the PCB structure shown in FIG. 2.

FIG. 3 is a graph showing a simulated example of the effective capacitance v. frequency response of the PCB structure shown in FIG. 2. This graph is simulated by using a known simulation software "hfss" offered by Ansoft, Inc. With the capacitance values normalized to 1 pF at 100 MHz, the graph shows that the effective capacitance of the PCB shown in FIG. 2 increases as the frequency increases. A similar response exists had the capacitor been a simple parallel plate capacitor.

Figure 4A:
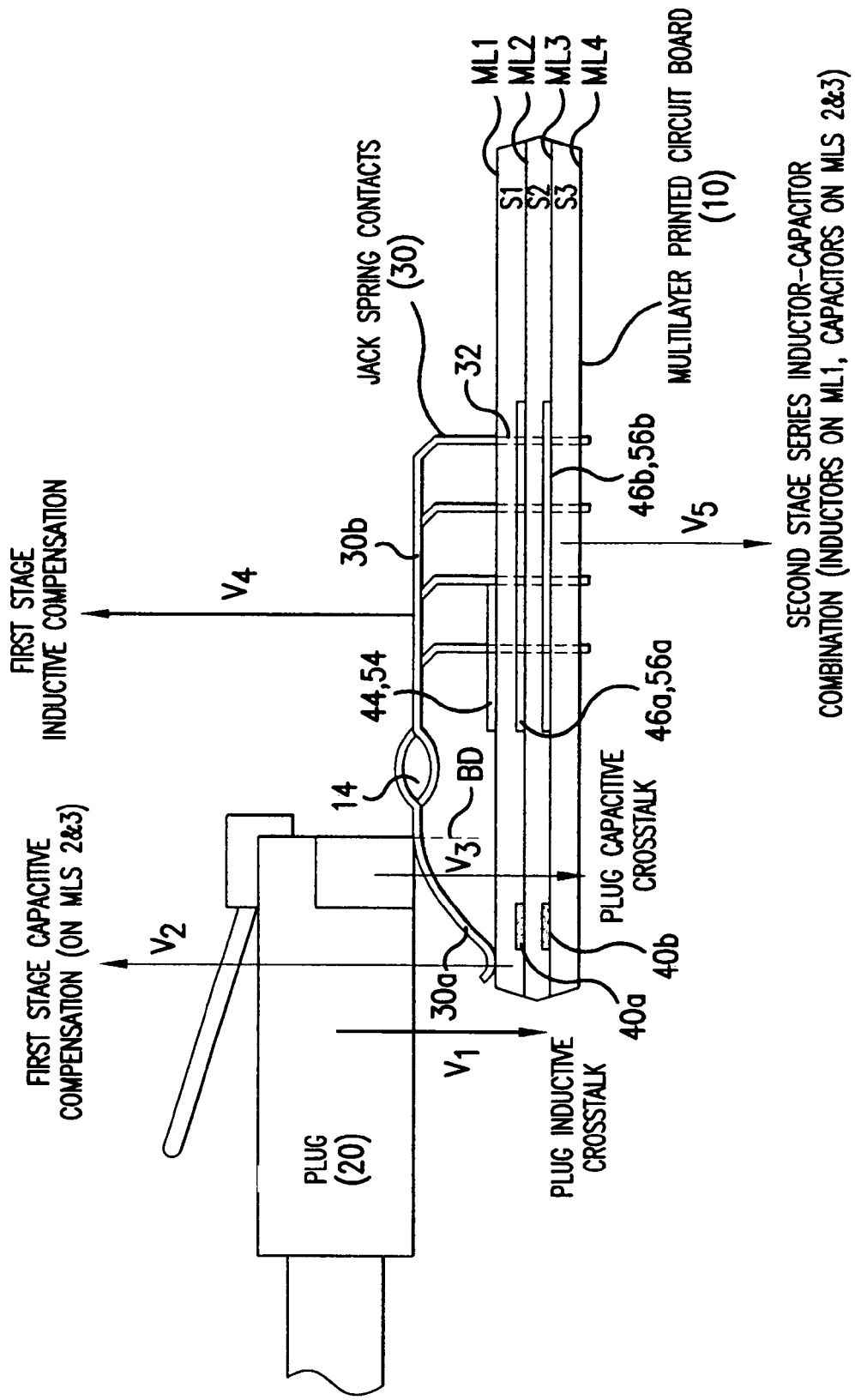
FIG. 4A is a side view of a connector according to the first embodiment of the present invention.
Figure 4B:
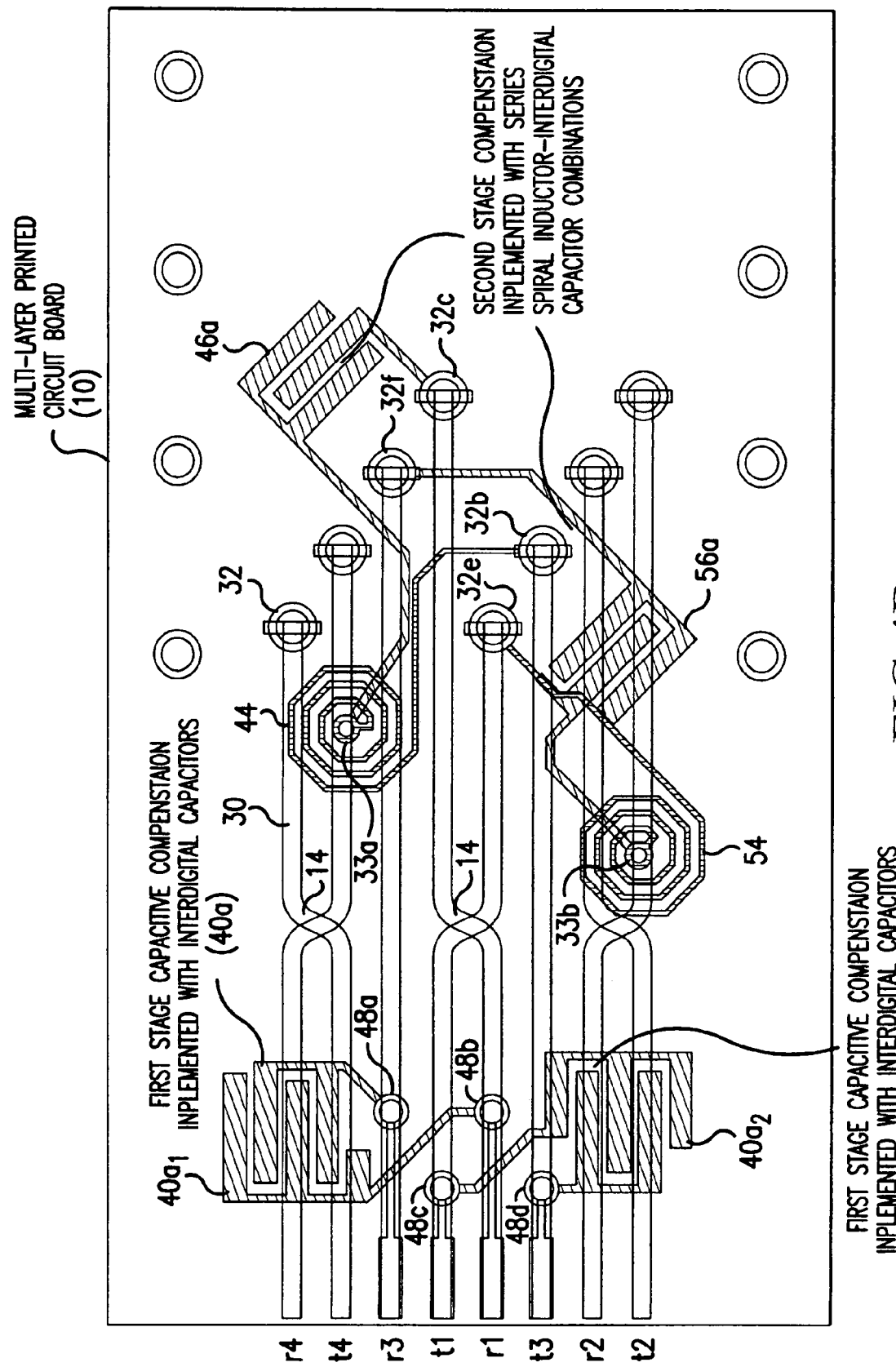
FIG. 4B is a top plan view of the PCB and NEXT compensation elements of FIG. 4A according to the first embodiment of the present invention.

FIGS. 4A and 4B demonstrate how to apply the series L-C combination structure in this example to compensate for the 1-3 pair NEXT in a connector, according to the first embodiment. FIG. 4A is a side view of a connector according to the first embodiment of the present invention, and FIG. 4B is a top plan view of the PCB and NEXT compensation elements of FIG. 4A according to the first embodiment of the present invention.

Referring to FIGS. 4A and 4B, the connector includes spring contacts 30 having crossovers 14, and a PCB 10. A plug 20 is to mate with the connector. The plug 20 can be a modular plug such as one used at the end of a phone line or a patch cord used to connect a personal computer to a wall outlet. The contacts 30 can be soldered or press-fitted into plated-through holes 32 located at the appropriate portions of the PCB 10 and can be spring wire contacts. Moreover, the contacts 30 have a current carrying portion 30b and a non-current carrying portion 30a, where a boundary BD between these portions 30a and 30b are indicated in FIG. 4A. The contacts 30 and the PCB 10 can be housed in a housing such as a modular jack, so that when the plug 20 enters the jack, the electrical contacts on the plug 20 mate with the electrical contacts on the PCB 10 via the contacts 30.

The PCB 10 is a multi-layered board made of resin or other material known suitable as a PCB material. In this example, the PCB 10 is composed of three substrates (S1-S3) and four metalized layers (ML1-ML4) alternatingly stacked up. More specifically, the substrates and the metalized layers are stacked up in the following order (from top to bottom): ML1, S1, ML2, S2, ML3, S3, and ML4. The metalized layers ML1-ML4 each represent metal conductive patterns formed on the upper surface of the substrate directly below the corresponding metalized layer. Certain parts of the metalized layers are interconnected with each other for electrical connection through one or more conductive vias 32 such as plated through holes. The spring contacts 30 as shown are formed above the first metalized layer ML1.

The spring contacts 30 can be a plurality of wire pairs P, each wire pair P including contacts designated as a ring (r) and a tip (t). In FIG. 4B, four pairs are provided and they are (t1, r1), (t2, r2), (t3, r3), and (t4, r4). The ring is known to be a negatively polarized conductor and the tip is known to be a positively polarized conductor.

First and second pairs of interdigital capacitors 40a and 40b act as capacitive compensation for the first stage NEXT compensation and are formed respectively on or as part of the second and third metalized layers ML2 and ML3 of the PCB 10. In this example, the jack springs in a section 30b are arranged after the cross-over at 14 to contribute inductive compensation also as part of the first stage compensation. The first pair of interdigital capacitors 40a on the layer ML2 is duplicated on the layer ML3 as the second pair of capacitors 40b. The first pair of interdigital capacitors 40a is made up of capacitors $40a_1$ and $40a_2$ both disposed on the layer ML2. The second pair of interdigital capacitors 40b is made up of capacitors $40b_1$ and $40b_2$ both disposed on the layer ML3. The ends of the first capacitor $40a_1$ in the first pair are in electrical contact with the rings r3 and r1 respectively through a pair of plated through holes 48a and 48b. The ends of the second capacitor $40a_2$ in the first pair are in electrical contact with the tips t1 and t3 respectively through a pair of plated through holes 48c and 48d. The second pair of interdigital capacitors 40b are capacitors $40b_1$ and $40b_2$ both disposed on the layer ML3 in the same manner as the first pair of interdigital capacitors 40a. Through plated through holes 48a and 48b, the capacitors $40a_1$ and $40b_1$ are electrically connected in parallel. Similarly, through plated through holes 48c and 48d, the capacitors $40a_2$ and $40b_2$ are electrically connected in parallel.

Furthermore, series L-C combination structures that act as second stage NEXT compensation structures are provided at the PCB 10. The first series L-C combination structure includes a spiral inductor 44 and first and second interdigital capacitors 46a and 46b. The spiral inductor 44 is disposed on or above the first metalized layer ML1, whereas the first and second interdigital capacitors 46a and 46b are disposed respectively on the second and third metalized layers ML2 and ML3. In the similar manner, the second series L-C combination structure includes a spiral inductor 54 and third and fourth interdigital capacitors 56a and 56b. The spiral inductor 54 is disposed on or above the first metalized layer ML1, whereas the third and fourth interdigital capacitors 56a and 56b are disposed respectively on the second and third metalized layers ML2 and ML3. In this example, the first and third capacitors 46a and 56a on the layer ML2 are duplicated on the layer ML3 as the second and fourth capacitors 46b and 56b, respectively. Through plated through holes 33a and 32c, the capacitors 46a and 46b are connected electrically in parallel. Through plated through holes 33b and 32f, the capacitors 56a and 56b are connected electrically in parallel.

In the present application, "duplicated" with respect to the compensation capacitors means identically copied on all the designated metalized layers. For instance, the capacitors 40a would have the identical shape and size and would be vertically aligned with the capacitors 40b. The reason for duplicating the interdigital capacitors is to increase the capacitance without having to increase the foot-print (surface coverage). Also larger foot-print interdigital capacitors could be used without the need for this duplication. On the other hand, if the printed circuit board was constructed with more metalized layers, the interdigital capacitors can be duplicated on more than two metalized layers to make the foot-print even smaller if desired. Note that within the spirit of the first embodiment, parallel plate capacitors could be used in place of the interdigitated capacitors 46a, 46b, 56a and 56b. Also the first stage capacitors 40a and 40b could also have been parallel plate capacitors, as used in, e.g., FIG. 10 to be discussed later.

The inductor 44 is connected in series with each of the first and second interdigital capacitors 46a and 46b through the plated through hole 33a. One end of the inductor 44 is electrically connected to the tip t3 through a plated through hole 32b. One end of each of the first and second capacitors 46a and 46b is electrically connected to the ring r1 through the plated through hole 32c. In a similar manner, the inductor 54 is connected in series with each of the third and fourth interdigital capacitors 56a and 56b through the conductive via 33b. One end of the inductor 54 is electrically connected to the tip t1 through a plated through hole 32e. One end of each of the third and fourth capacitors 56a and 56b is electrically connected to the ring r3 through the plated through hole 32f.

According to the present invention, the use of the series L-C combination structures for the second stage NEXT compensation of a two stage compensation approach, which is shown in this is example for the 1-3 pair combination, improves performance at high frequencies if the plug 20 is a low crosstalk plug and improves performance at low frequencies if the plug 20 is a high crosstalk plug. An explanation on how this works is as follows.

NEXT is attributed to two factors: capacitive coupling and inductive coupling. The close proximity of two wires creates capacitive coupling, whereas the current flowing through these wires creates inductive coupling. Thus, the plug 20 introduces both the capacitive coupling and inductive coupling as it mates with the contacts 30. Both of these factors add to generate near end crosstalk or NEXT.

To reduce or compensate for the NEXT, two stages of compensation are generally used. The first stage is phased in opposition to the plug NEXT while the second stage is phased in the same direction of the plug NEXT. This is known and disclosed in the '358 patent. The direction of the compensation relative to that of the plug is illustratively shown as arrows V1 to V5 in FIG. 4A.

Also, crosstalk generated at the far end of a connector is called FEXT. To compensate for this parameter, some portion of the normal NEXT compensation must include an inductive component. This component is part of the first stage of the two stage compensator described here. This occurs in the section 30b of the jack spring wires just beyond the crossover 14. In this region of compensation, the compensation is relatively stable with frequency.

A significant part of the first stage compensation for NEXT is capacitive compensation and is provided by using the capacitors 40a and 40b. In FIGS. 4A and 4B, this part of the first stage is at a minimal delay from the original crosstalk, being at a portion of the PCB 10 where electrically it is directly connected, via the non-current carrying portion 30a of the contacts 30, to where the contacts of the plug 20 intercept the contacts 30. The net first stage compensation which is the capacitive portion before crossover 14 plus the inductive portion just beyond the crossover 14 is in opposition to the crosstalk generated in the plug. The second stage is at a further delay from the first stage, being at a portion of the PCB 10, which is at some distance from where the contacts of the plug 20 intercept the contacts 30 via the current carrying portion 30b of the contacts 30. It has a compensation direction which is in the same direction of the plug crosstalk.

The interdigital capacitors 40a and 40b are placed on the inner metalized layers as part of the first stage. The series L-C combination structures are placed at the second stage. The magnitude of the first stage compensation, which is mostly capacitive and without an added series inductive element, is made relatively flat with frequency. The second stage capacitive compensation, on the other hand, is made to increase with frequency by placing the series L-C combination structures in the PCB layers. As a result, the net compensation crosstalk (fabricated crosstalk) of the connector, which is comprised of the first stage compensation crosstalk minus the second stage compensation crosstalk, declines with increasing frequency. In other words, the net compensation crosstalk becomes variable depending on the frequency, such that the present invention provides a lower-level of compensation crosstalk at a high frequency than would normally exist without the series inductor in place. This minimizes crosstalk over-compensation in the connector at high frequencies. Also the frequency dependent compensation provides a higher-level of compensation crosstalk at a low frequency to minimize crosstalk under-compensation at low frequencies in the connector. By providing the low-level compensation crosstalk at a high frequency, the present invention improves the high frequency margin of the connector when a low crosstalk plug is inserted into the jack. On the other hand, by providing the high-level compensation crosstalk at a low frequency, the present invention improves the low frequency margin of the connector when a high crosstalk plug is inserted into the jack.

Another method of achieving an increase in effective capacitance with an increase in frequency is to exploit the self resonance characteristic of an interdigital capacitor described in an article entitled "Interdigital Capacitors and their Application to Lump-element Microwave Integrated Circuits" by Gary D. Alley, IEEE Transactions on Microwave Theory and Techniques, Vol. MTT-18, No. 12, December 1970, pp. 1028-1033. In the article Alley teaches that an interdigital capacitor exhibits self resonance at a frequency determined by its length-to-width ratio.

Figure 5:
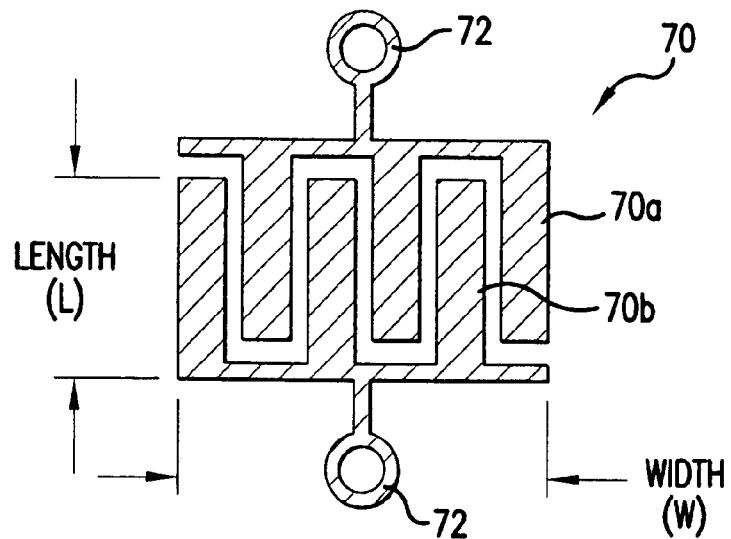
FIG. 5 shows an example of the structure of an interdigital capacitor according to a second embodiment of the present invention.
Figure 6:
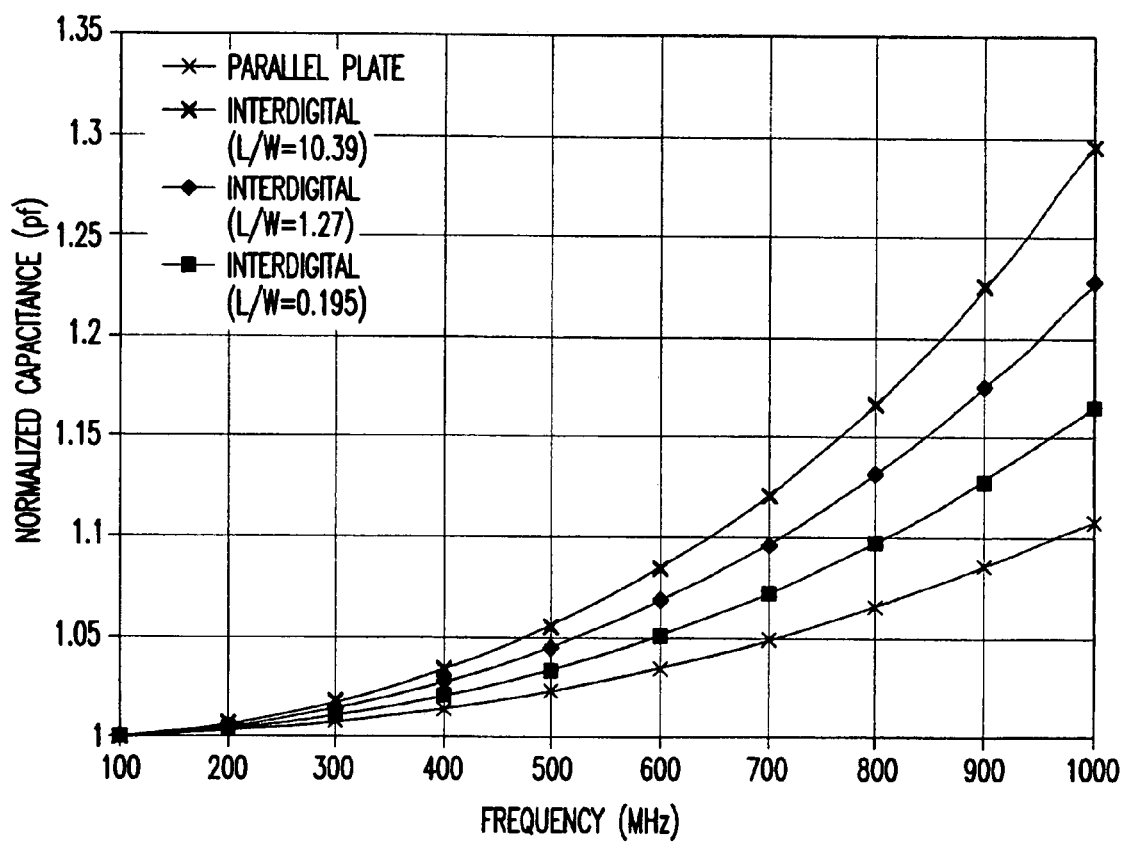
FIG. 6 is a graph showing a simulated example of the effective capacitance v. frequency response of interdigital capacitors with different length/width ratios.

As shown in FIG. 5, an interdigital capacitor 70 includes first and second combs 70a and 70b that are intermeshed with each other, and terminals 72. The length (L) and width (W) of the interdigital capacitor is defined as shown. As the length-to-width ratio (L/W) of the interdigital capacitor increases, the frequency at which it exhibits self resonance decreases. This is manifested in a higher rate of increase in effective capacitance throughout the bandwidth of interest provided that the frequency of resonance remains above that bandwidth. This is shown in FIG. 6, which is a graph showing the effective capacitance v. frequency response of interdigital capacitors with different L/W ratios. This graph shows the result of simulation by the software "hfss" offered by Ansoft, Inc. and compares the frequency dependence of different interdigital capacitor geometries as well as the parallel plate capacitor. As shown in FIG. 6, an elongated interdigital capacitor having the L/W ratio of 10.39 has the highest rate of increase in effective capacitance with respect to an increase in frequency, in comparison with interdigital capacitors with the L/W ratios of 1.27 and 0.195 and in comparison with a parallel plate type capacitor. All responses in the graph are normalized to 1 pf at 100 MHz for this comparison.

Figure 7A:
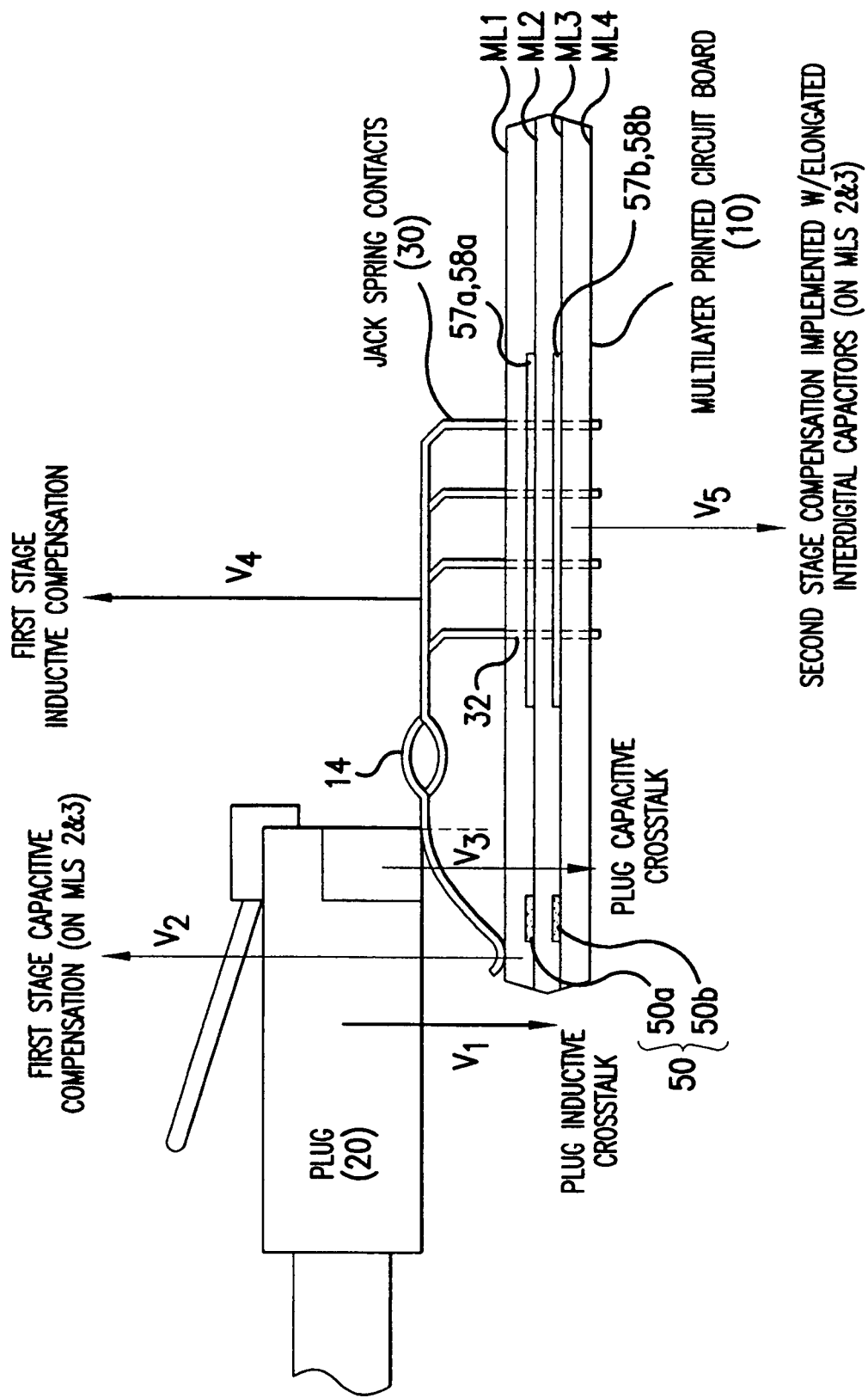
FIG. 7A is a side view of a connector according to the second embodiment of the present invention.
Figure 7B:
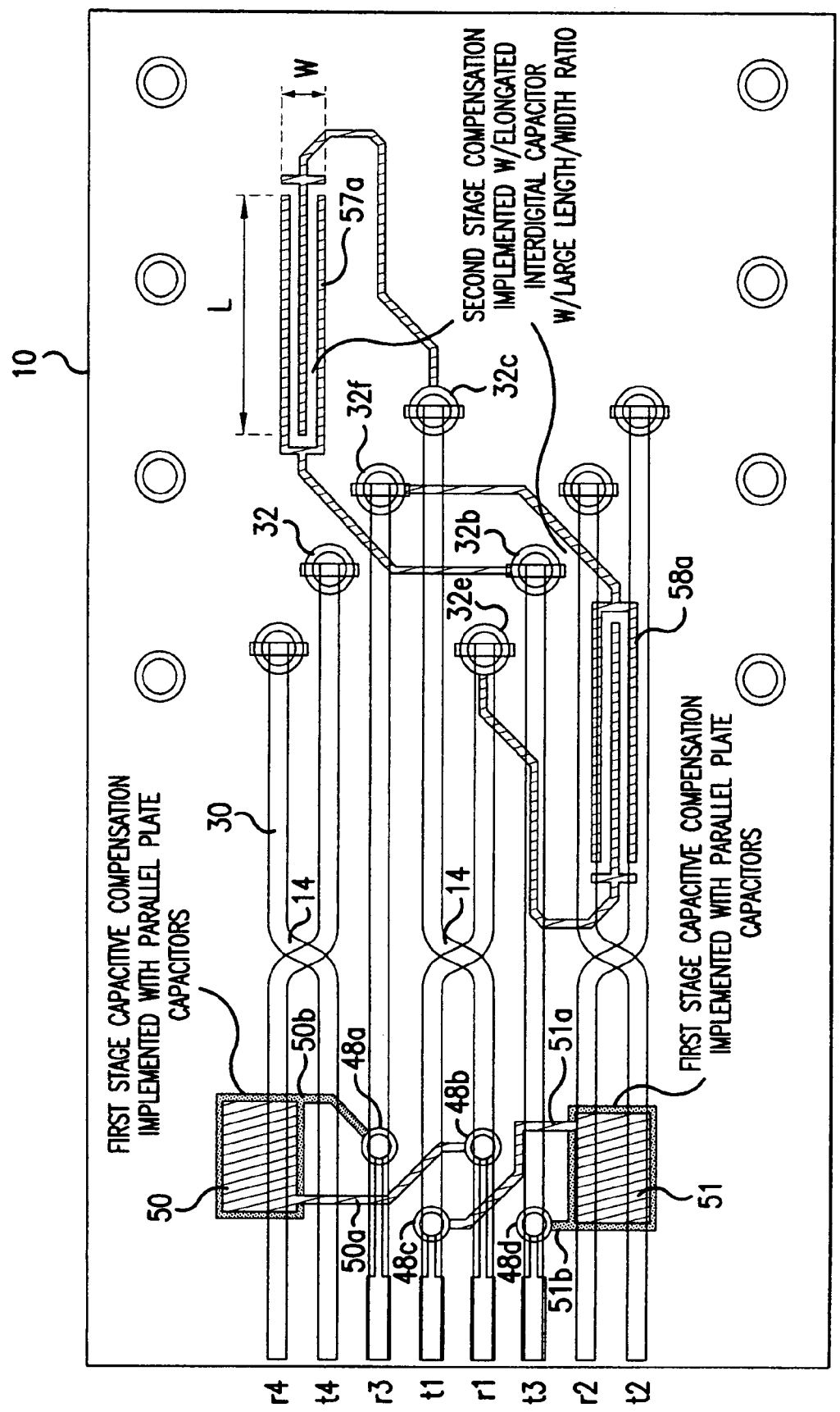
FIG. 7B is a top plan view of the PCB and NEXT compensation elements of FIG. 7A according to the second embodiment of the present invention.

The self resonance characteristic of an elongated interdigital capacitor discussed above is used to provide NEXT compensation in a multi-stage compensation system according to the second embodiment of the present invention. FIG. 7A is a side view of a connector according to this second embodiment of the present invention, and FIG. 7B is a top plan view of the PCB and NEXT compensation elements of FIG. 7A. The second embodiment is identical to the first embodiment, except that different types of NEXT compensation elements are used. Particularly, the first stage compensation capacitors are implemented using first and second parallel plate capacitors 50 and 51, and the second stage compensation elements are implemented using a first pair of elongated interdigital capacitors 57a and 58a and a second pair of elongated interdigital capacitors 57b and 58b. A parallel plate capacitor is a capacitor composed of two parallel metal plates each at a different potential, and is known.

The two plates (50a and 50b in FIG. 7A) of the first parallel plate capacitor 50 are respectively formed on the second and third metalized layers ML2 and ML3. In the same manner, the two plates of the second parallel plate capacitor 51 are respectively formed on the second and third metalized layers ML2 and ML3. The plate 50a of the capacitor 50 is connected to the ring r1 through the plated through hole 48b. The plate 50b of the capacitor 50 is connected to the ring r3 through the plated through hole 48a. Similarly, the plate 51a of the second parallel plate capacitor 51 is connected to the tip t1 through the plated through hole 48c and the plate 51b of the capacitor 51 is connected to the tip t3 through the plated through hole 48d.

The first pair of elongated interdigital capacitors 57a and 58a are formed as part of the metalized layer ML2, and the second pair of elongated interdigital capacitors 57b and 58b are formed as part of the third metalized layer ML3. One end of each of the elongated capacitors 57a and 57b is electrically connected to the ring r1 through the plated through hole 32c, whereas the other end of each of the elongated capacitors 57a and 57b is electrically connected to the tip t3 through the plated through hole 32b. Therefore, the interdigital capacitors 57a and 57b are electrically placed in parallel, to achieve higher capacitance. In the similar manner, one end of each of the elongated capacitors 58a and 58b is electrically connected to the ring r3 through the plated through hole 32f, whereas the other end of each of the elongated capacitors 58a and 58b is electrically connected to the tip t1 through the plated through hole 32e. Therefore the capacitors 58a and 58b are electrically placed in parallel to achieve higher capacitance.

Accordingly, the magnitude of the first stage compensation capacitive coupling is made relatively flat with frequency by placing the parallel plate capacitors at the first stage of the connector. The second stage compensation capacitive coupling is made to increase with frequency by placing the elongated interdigital capacitors with large L/W ratios at the second stage of the connector. As a result, the net compensation crosstalk of the connector declines with the increase of frequency.

In a third embodiment of the present invention, the methods of the first and second embodiments are combined. Particularly, in the third embodiment, the second stage compensation elements are implemented using a series L-C combination structure, where this structure as shown in, e.g., FIG. 8, includes a spiral inductor 72 connected in series with an elongated interdigital capacitor 74 with a large L/W ratio and disposed at the PCB 10. In other words, the connector of the third embodiment is identical to the connector of the first embodiment shown in FIGS. 4A and 4B, except that each of the second stage interdigital capacitors 46a, 46b, 56a and 56b is elongated to have a large L/W ratio.

Figure 8:
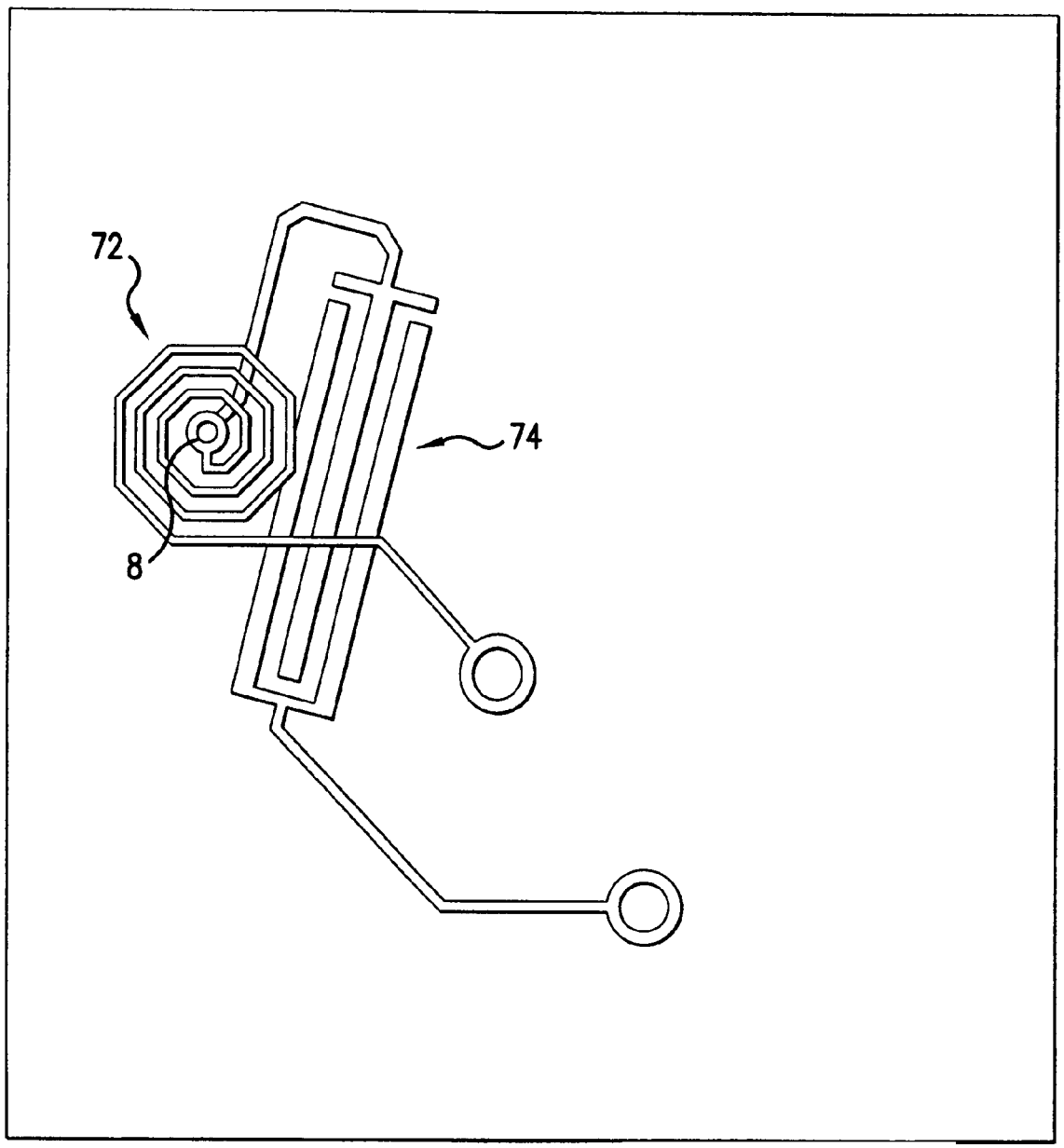
FIG. 8 is a perspective view of a simplified PCB showing how the series inductor-capacitor combination of FIG. 1 can be implemented according to a third embodiment of the present invention.

In a fourth embodiment and a fifth embodiment of the present invention, the method of the second and third embodiments can be implemented respectively using a folded elongated interdigital capacitor in place of the high aspect ratio interdigital capacitor shown in FIG. 8. An example of a folded elongated interdigital capacitor is shown in an exploded view in FIG. 9.

Figure 9:
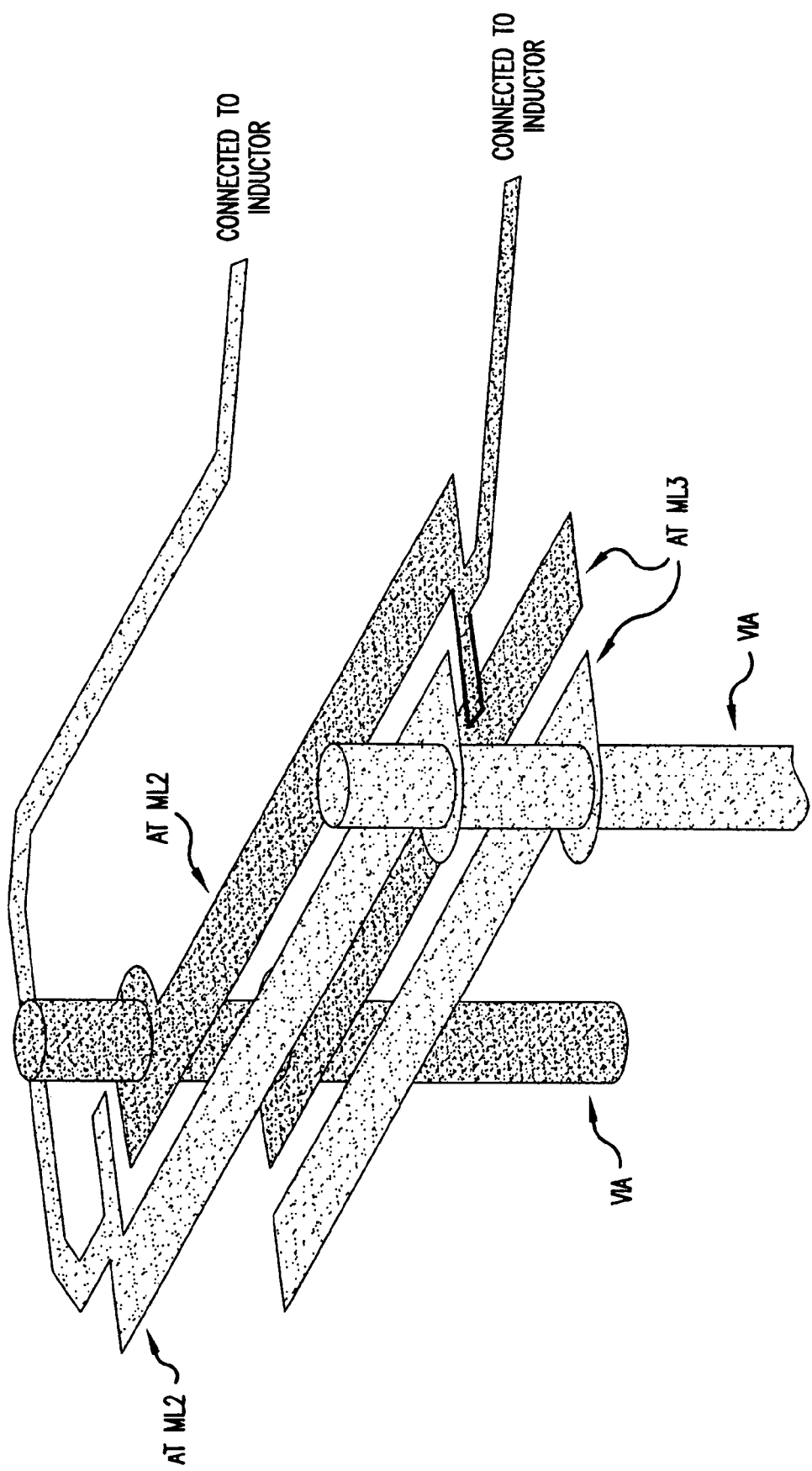
FIG. 9 is an example of a folded elongated interdigital capacitor according to a fourth embodiment of the present invention.

More specifically, in the fourth embodiment, the two regular elongated interdigital capacitors 57a and 57b formed respectively at the metalized layers ML2 and ML3 of the PCB as shown in FIGS. 7A and 7B of the second embodiment are replaced with one folded elongated interdigital capacitor with its layers provided at the metalized layers ML2 and ML3 as indicated in FIG. 9. In the same manner, the two regular elongated interdigital capacitors 58a and 58b formed respectively at the metalized layers ML2 and ML3 of the PCB as shown in FIGS. 7A and 7B of the second embodiment are replaced with one folded elongated interdigital capacitor with its layers provided at the metalized layers ML2 and ML3 as indicated in FIG. 9.

Figure 10:
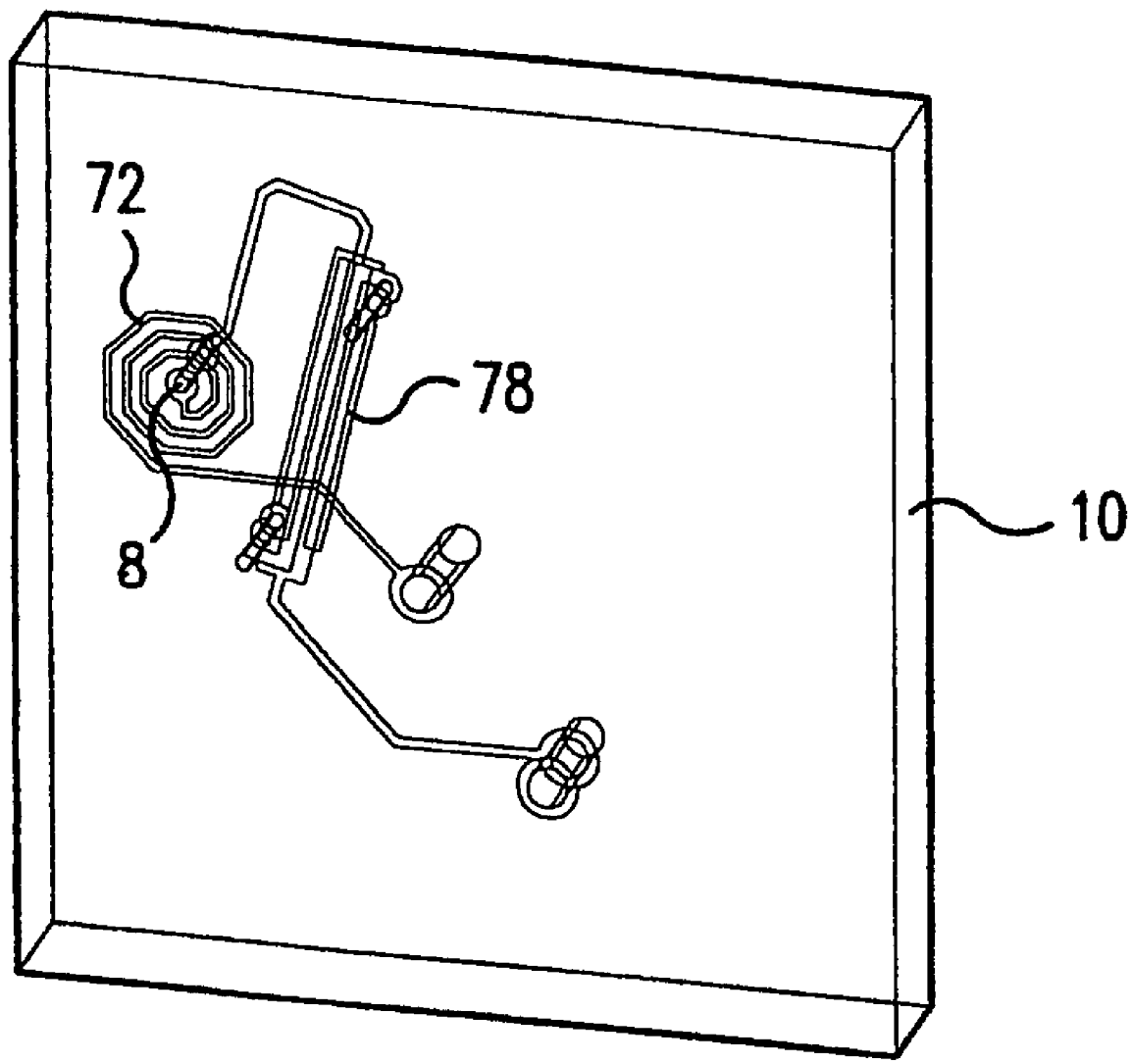
FIG. 10 is a perspective view of a simplified PCB showing how the series inductor-capacitor combination of FIG. 1 can be implemented according to a fifth embodiment of the present invention.

The fifth embodiment is identical to the third embodiment, except that the regular elongated interdigital capacitor 74 shown in FIG. 8 of the third embodiment is replaced with a folded elongated interdigital capacitor 78 as shown as FIG. 10. This folded elongated interdigital capacitor 78 has the same structure as the folded elongated interdigital capacitor shown in FIG. 9. Since the third embodiment is identical to the first embodiment shown in FIGS. 4A and 4B, except for the use of the elongated interdigital capacitors shown in FIGS. 7A and 7B, the fifth embodiment simply is identical to the first embodiment shown in FIGS. 4A and 4B, except that the interdigital capacitors 46a, 46b, 56a and 56b are replaced with the folded elongated interdigital capacitors having large L/W ratios.

More specifically, in the fifth embodiment, the two regular interdigital capacitors 46a and 46b formed respectively at the metalized layers ML2 and ML3 of the PCB as shown in FIGS. 4A and 4B of the first embodiment are replaced with one folded elongated interdigital capacitor with its layers provided at the second and third metalized layers ML2 and ML3 (e.g., as indicated in FIG. 9). In the same manner, the two regular interdigital capacitors 56a and 56b formed respectively at the metalized layers ML2 and ML3 of the PCB as shown in FIGS. 4A and 4B of the second embodiment are replaced with one folded elongated interdigital capacitor with its layers provided at the metalized layers ML2 and ML3.

Figure 11:
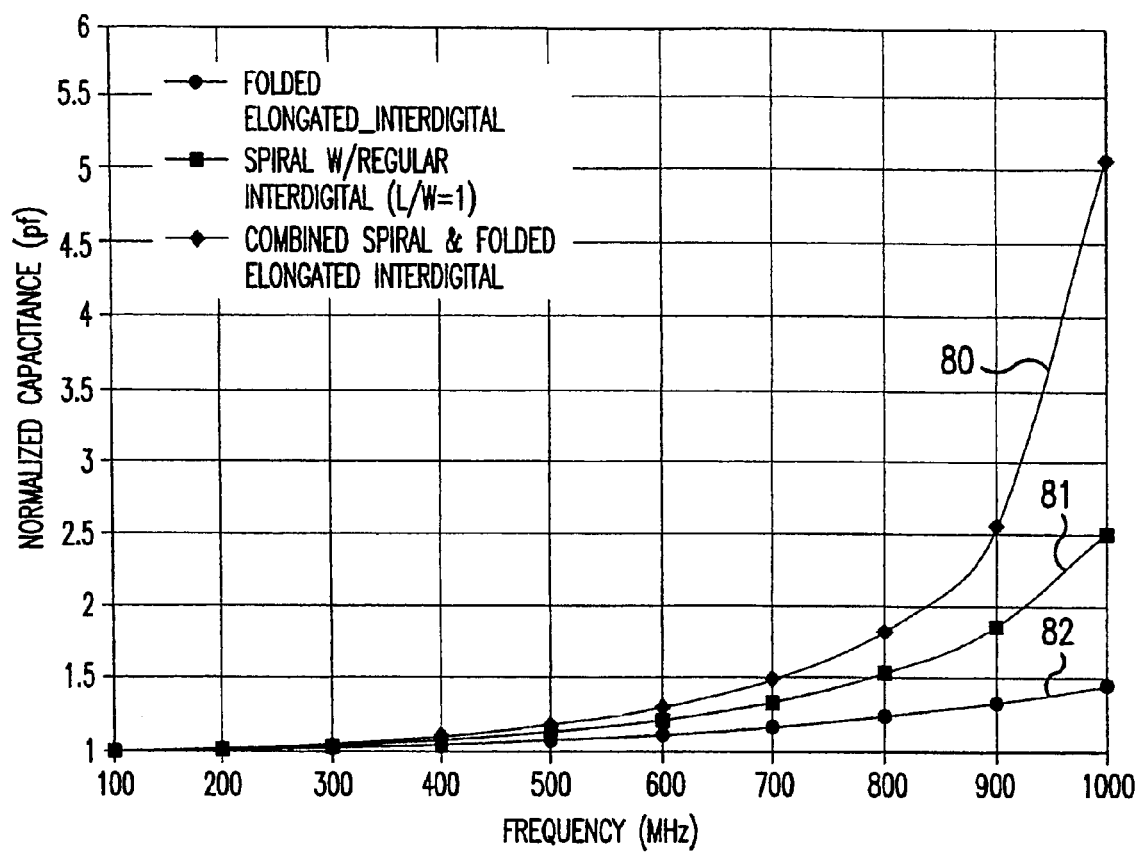
FIG. 11 is a graph comparing, as an example, the effective capacitance v. frequency responses of the NEXT compensated PCBs of the various embodiments of the present invention.

FIG. 11 is a graph comparing, as an example, the effective capacitance v. frequency responses of the first, fourth and fifth embodiments of the present invention. This graph shows the result of simulation produced by the software "hfss" offered by Ansoft, Inc. and all responses in the graph are normalized to 1 pf at 100 MHz for this comparison. As shown in FIG. 11, the combination of the spiral inductor and the folded elongated interdigital capacitor connected in series at the second stage according to the fifth embodiment (response 80) yields an effective capacitance increase with frequency that is higher than what would be obtained with the compensation schemes according to the first embodiment (response 81), or fourth embodiment (response 82).

Figure 12A:
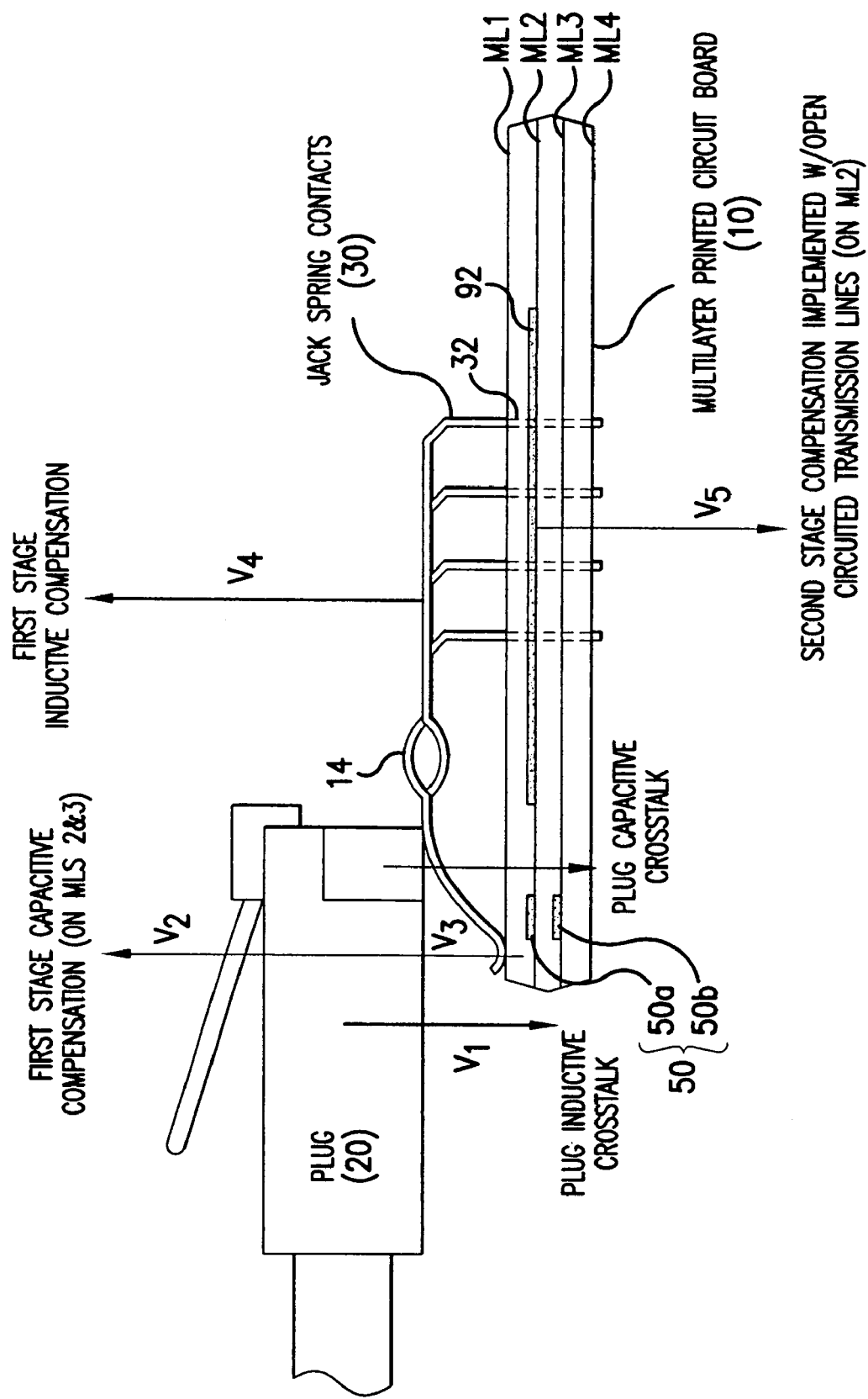
FIG. 12A is a side view of a connector according to a sixth embodiment of the present invention.
Figure 12B:
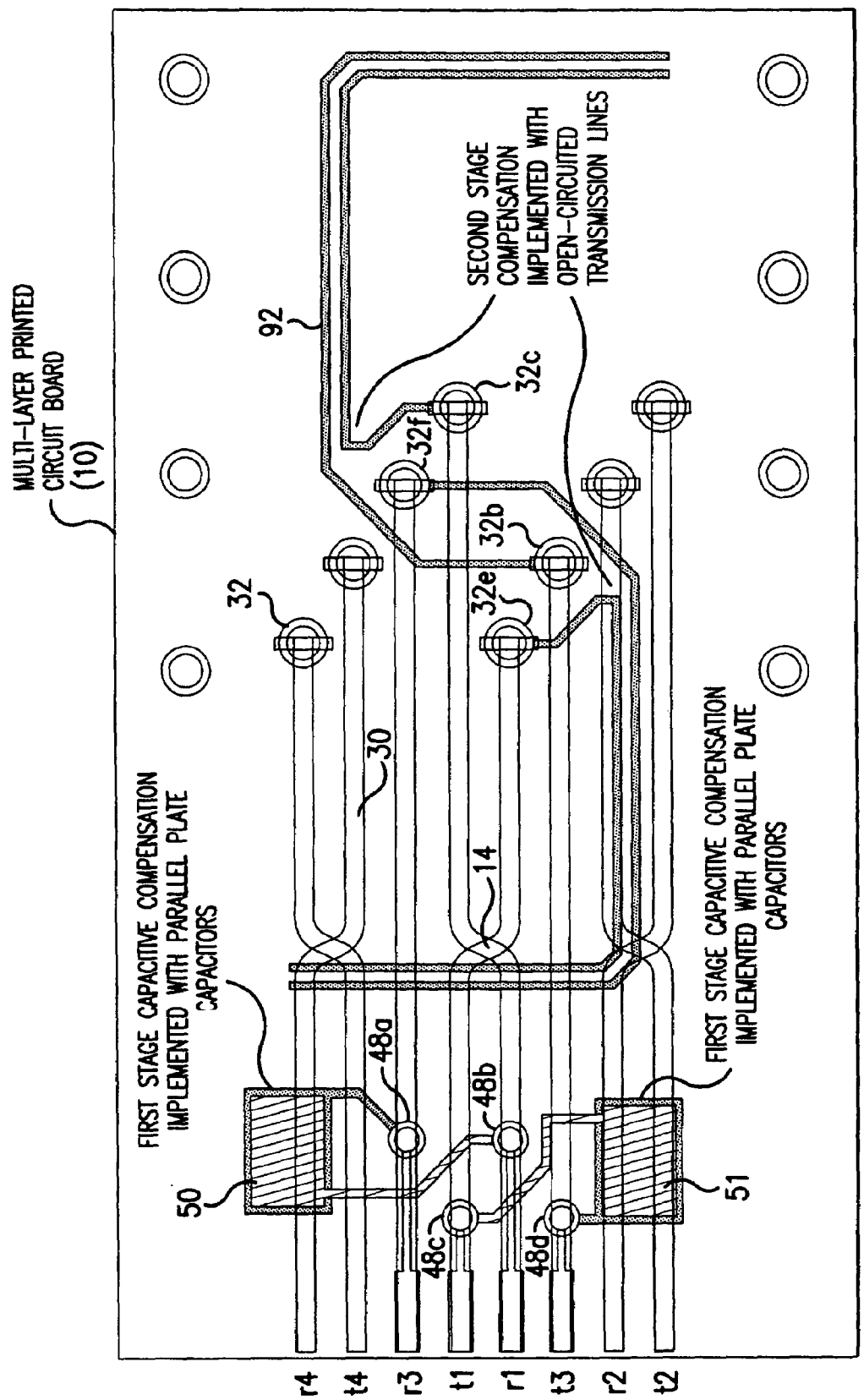
FIG. 12B is a top plan view of the PCB and NEXT compensation elements of FIG. 12A according to the sixth embodiment of the present invention.

FIG. 12A is a side view of a connector according to a sixth embodiment of the present invention, and FIG. 12B is a top plan view of the PCB and NEXT compensation elements of FIG. 12B. As shown in FIGS. 12A and 12B, this sixth embodiment is identical to the second embodiment, except that open-circuited transmission lines 92 (92a, 92b, 92c and 92d) are used as the second stage compensation elements. In this case the first stage compensation capacitors are implemented using the parallel plate capacitors 50 and 51 as in the second embodiment, and the second stage capacitive compensation elements are implemented using the open-circuited transmission lines 92 on the second metalized layer ML2 at the PCB 10. Resonance in this embodiment occurs at the frequency where the length of the transmission line 92 becomes equal to a quarter wavelength at the resonant frequency.

Although four layered PCB structures are illustrated, it should be readily apparent that any other number of PCB substrates and/or metalized layers may be used for the PCB (s). The resultant connector of the present invention can be associated with housings, insulation displacement connectors, jack spring contacts, etc. Also, the various configurations and features of the above embodiments may be combined or replaced with those of other embodiments. Where the capacitors of interdigital type are used, plate capacitors or discreet capacitors may be used instead. Also, the inductors can be implemented using geometries other than the circular spiral shown in FIG. 4B, such as oval spiral, square spiral, rectangular spiral, solenoid, or discreet inductors. Wherever the interdigital capacitors are used, such capacitors can be duplicated with respect to the corresponding other interdigital capacitors. In one connector, some of the interdigital capacitors can be implemented on a single metalized layer or on several metalized layers.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention.

What is claimed is:

1. An electrical connector, comprising:
    a plurality of input terminals;
    a plurality of output terminals;
    a plurality of conductive paths connecting respective of the plurality of input terminals with respective of the plurality of output terminals; and
    a conductive branch path connected to a first conductive path of the plurality of conductive paths,
    wherein the conductive branch path includes a self inductance region where a first portion of the conductive branch path inductively couples with a second portion of the conductive branch path, and
    wherein the conductive branch path includes a third portion which capacitively couples with a second conductive path of the plurality of conductive paths.

2. The electrical connector of claim 1, wherein the first, second and third portions of the conductive branch path comprise a series inductor-capacitor combination.

3. The electrical connector of claim 1, wherein the self inductance region of the first conductive path is formed by a spiral inductor.

4. An electrical connector, comprising:
a plurality of input terminals;
a plurality of output terminals;
a plurality of conductive paths connecting respective of the plurality of input terminals with respective of the plurality of output terminals;
a first compensation structure electrically coupled to at least a first of the conductive paths, the first compensation structure having a first effective capacitance response as a function of frequency; and
a second compensation structure electrically coupled to at least the first of the conductive paths, the second compensation structure having a second effective capacitance response as a function of frequency that is different than the first effective capacitive response, wherein the first compensation structure has a relatively flat effective capacitance response as a function of increasing frequency.

5. The electrical connector of claim 4, wherein the second compensation structure has an increasing effective capacitance response as a function of increasing frequency.

6. The electrical connector of claim 4, wherein an overall compensation provided to the first of the conductive paths by the first compensation structure and the second compensation structure decreases with increasing frequency.

7. The electrical connector of claim 6, wherein the second compensation structure comprises a series inductor-capacitor combination.

8. The electrical connector of claim 7, wherein the inductor is implemented by routing a first portion of the first conductive path adjacent a second portion of the first conductive path.

9. The electrical connector of claim 7, wherein the inductor comprises a spiral portion in the first conductive path.

10. The electrical connector of claim 6, wherein the first compensation structure provides a compensation signal having a first polarity and the second compensation structure provides a compensation signal having a polarity generally opposite the first polarity.

11. The electrical connector of claim 6, wherein the second compensation structure comprises an elongated interdigital capacitor.

12. The electrical connector of claim 6, wherein the second compensation structure comprises a folded elongated interdigital capacitor.

13. The electrical connector of claim 6, wherein the second compensation structure comprises an open-circuited transmission line.

14. An electrical connector, comprising:
a plurality of input terminals;
a plurality of output terminals;
a plurality of conductive paths connecting respective of the plurality of input terminals with respective of the plurality of output terminals;
a first compensation structure electrically coupled to at least a first of the conductive paths, the first compensation structure having a first effective capacitance response as a function of frequency; and
a second compensation structure electrically coupled to at least the first of the conductive paths, the second compensation structure having a second effective capacitance response as a function of frequency that is different than the first effective capacitive response, wherein at least one of the first effective capacitance response as a function of frequency and/or the second effective capacitance response as a function of frequency is selected to simultaneously improve a net crosstalk compensation provided by the first and second compensation structures at frequencies less than 100 MHz when a high crosstalk plug is used with the electrical connector and the net crosstalk compensation provided by the first and second compensation structures at frequencies greater than 250 MHz when a low crosstalk plug is used with the electrical connector.

15. A connector for reducing crosstalk, comprising:
a printed circuit board (PCB);
a first compensation structure provided on the PCB at a first stage area of the PCB and coupled to a first of a plurality of conductive paths within the connector;
a second compensation structure, provided at a second stage area of the PCB and coupled to the first of the plurality of conductive paths within the connector, for increasing a compensation capacitance with increasing frequency; and
at least one conductive contact projecting away from the PCB, wherein the first compensation structure provides a compensation signal having a first polarity and the second compensation structure provides a compensation signal having a polarity generally opposite the first polarity.

16. The connector of claim 15, wherein the second compensation structure includes at least one series inductor-capacitor combination, the series inductor-capacitor combination including an inductor and at least one capacitor in series with the inductor.

17. The connector of claim 16, wherein the inductor is a spiral inductor.

18. The connector of claim 16, wherein the at least one capacitor includes at least one parallel plate capacitor.

19. The connector of claim 16, wherein the at least one capacitor includes:
a first interdigital capacitor in series with the inductor and disposed on a first metalized layer of the PCB; and
a second interdigital capacitor in series with the inductor and disposed on a second metalized layer of the PCB.

20. The connector of claim 19, wherein the inductor is a spiral inductor.

* * * * *